(12) United States Patent
Baselmans et al.

(10) Patent No.: US 7,649,676 B2
(45) Date of Patent: Jan. 19, 2010

(54) SYSTEM AND METHOD TO FORM UNPOLARIZED LIGHT

(75) Inventors: Johannes Jacobus Matheus Baselmans, Oirschot (NL); Huibert Visser, Zevenhuizen (NL)

(73) Assignee: ASML Netherlands B.V., Veldhoven (NL)

( * ) Notice: Subject to any disclaimer, the term of this patent is extended or adjusted under 35 U.S.C. 154(b) by 264 days.

(21) Appl. No.: 11/452,435

(22) Filed: Jun. 14, 2006

(65) Prior Publication Data

US 2007/0291372 A1    Dec. 20, 2007

(51) Int. Cl.
G02B 26/08    (2006.01)

(52) U.S. Cl. .................. 359/301; 359/302; 359/303

(58) Field of Classification Search ......... 359/301–303, 359/629, 831, 832, 834; 372/27, 106; 355/71
See application file for complete search history.

(56) References Cited

U.S. PATENT DOCUMENTS

| | | | |
|---|---|---|---|
| 4,511,220 A | 4/1985 | Scully | |
| 4,619,508 A | 10/1986 | Shibuya et al. | |
| 4,744,615 A | 5/1988 | Fan et al. | |
| 4,974,919 A | 12/1990 | Muraki et al. | |
| 5,005,969 A | 4/1991 | Kataoka | |
| 5,153,773 A | 10/1992 | Muraki et al. | |
| 5,229,872 A | 7/1993 | Mumola | |
| 5,296,891 A | 3/1994 | Vogt et al. | |
| 5,363,170 A | 11/1994 | Muraki | |
| 5,467,166 A * | 11/1995 | Shiraishi | 355/71 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,636,006 A | 6/1997 | Wu | |
| 5,677,703 A | 10/1997 | Bhuva et al. | |
| 5,808,797 A | 9/1998 | Bloom et al. | |
| 5,982,553 A | 11/1999 | Bloom et al. | |
| 6,008,943 A | 12/1999 | Metelitsa | |
| 6,133,986 A | 10/2000 | Johnson | |
| 6,169,634 B1 | 1/2001 | Sirat | |
| 6,177,980 B1 | 1/2001 | Johnson | |
| 6,310,679 B1 | 10/2001 | Shiraishi | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,906,805 B1 | 6/2005 | Ina et al. | |

(Continued)

FOREIGN PATENT DOCUMENTS

EP    1 521 110 A1    4/2005

(Continued)

*Primary Examiner*—Joseph Martinez
(74) *Attorney, Agent, or Firm*—Sterne, Kessler, Goldstein & Fox P.L.L.C.

(57) ABSTRACT

A system and method are used to form an unpolarized light beam from a polarized light beam. A system comprises a source of radiation and a unpolarizing system. The source of radiation produces a linear polarized beam. The unpolarizing system has first and second optical paths and splits the linear polarized beam. A first portion of the split beam travels along the first optical path having a first path length. A second portion of the split beam travels along the second optical path having a second, different path length. The first and second portions of the split beam are combined to form the unpolarized beam.

33 Claims, 13 Drawing Sheets

U.S. PATENT DOCUMENTS

| | | |
|---|---|---|
| 2002/0015156 A1 | 2/2002 | Ina et al. |
| 2002/0126479 A1 | 9/2002 | Zhai et al. |
| 2003/0147082 A1 | 8/2003 | Goldstein |
| 2004/0041104 A1 | 3/2004 | Liebregts et al. |
| 2004/0130561 A1 | 7/2004 | Jain |
| 2005/0007572 A1 | 1/2005 | George et al. |
| 2005/0036197 A1 | 2/2005 | Awamura |
| 2005/0207160 A1 | 9/2005 | Babayoff et al. |
| 2005/0226556 A1 | 10/2005 | Kanoshita et al. |
| 2006/0055834 A1 * | 3/2006 | Tanitsu et al. .................. 349/5 |

FOREIGN PATENT DOCUMENTS

| | | | |
|---|---|---|---|
| EP | 1 521 111 A1 | 4/2005 |
| JP | 59 226317 A2 | 12/1984 |
| JP | 1 114035 A2 | 5/1989 |
| JP | 1 295215 A2 | 11/1989 |
| JP | 6 244082 A2 | 9/1994 |
| JP | 10 012542 A2 | 1/1998 |
| JP | 11 204432 A2 | 7/1999 |
| JP | 2000/244050 A2 | 9/2000 |
| JP | 2001/021448 A2 | 1/2001 |
| JP | 2002/022410 A2 | 1/2002 |
| JP | 2003/133210 A2 | 5/2003 |
| WO | WO 98/33096 | 7/1998 |
| WO | WO 98/38597 | 9/1998 |

* cited by examiner

SYSTEM AND METHOD TO FORM UNPOLARIZED LIGHT

BACKGROUND

1. Field of the Invention

The present invention relates to radiation systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Typically, lithography systems use lasers as radiation sources to produce an illumination beam. Lasers typically produce polarized light, e.g., linearly, circularly, or elliptically polarized light. A problem with using polarized light as in an exposure process is that different polarization directions interact differently with respect to different types of coatings on optical elements within a lithography system. This can result in varying critical dimensions (CDs) in features formed on the substrate. Also, in masked-based systems, CDs of features formed on the substrate can vary because different directions of polarized light interact differently with diffraction patterns on a mask since the diffraction patterns can be polarization direction dependent. Thus, as a result of coatings or diffraction patterns, polarized light can result in varying CDs in features formed on the substrate.

This has been somewhat alleviated by using a compensation element made from birefringence material shaped into a wedge. In this case, the position on the wedge where a respective portion of the light enters will control what polarization direction the respective portion of the light will exhibit at an exit of the wedge. However, this has not been used to completely correct the imaging problems at the substrate.

Therefore, what is needed is a system and method that produces an unpolarized beam of radiation in order to substantially alleviate critical dimension variations in features formed on a substrate.

SUMMARY

In one embodiment of the present invention, there is provided a system comprising a source of radiation and an unpolarizing system. The source of radiation produces a linear polarized beam. The unpolarizing system splits the linear polarized beam, such that first and second portions of the linearly polarized beam travel along first and second optical paths. A first portion of the split beam travels along the first optical path having a first path length. A second portion of the split beam travels along the second optical path having a second, different path length. After traveling through the first and second path lengths, the first and second portions of the split beam are combined to form an unpolarized beam.

Additionally, or alternatively, the system can be a laser. Additionally, or alternatively, the system can be an illuminator.

Additionally, or alternatively, the system can be located within a lithography system, which includes a patterning device and a projection system. In this example, an illumination beam is formed from the unpolarized beam. The illumination beam is directed to be patterned by the patterning device, and the projection system projects the patterned beam onto a substrate.

In another embodiment, there is provided a device manufacturing method. A linearly polarized beam is split into first and second beams. The first beam is directed along a first optical path having a first optical path length. The second beam is directed along a second optical path having a second, different optical path length. After traveling along the first and second optical paths, the first beam from the first optical path is combined with the second beam from the second optical path to form an unpolarized beam.

Additionally, or alternatively, the unpolarized beam is used as an illumination beam in lithography. The illumination beam is patterned. The patterned beam is projected onto a target portion of a substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 5:
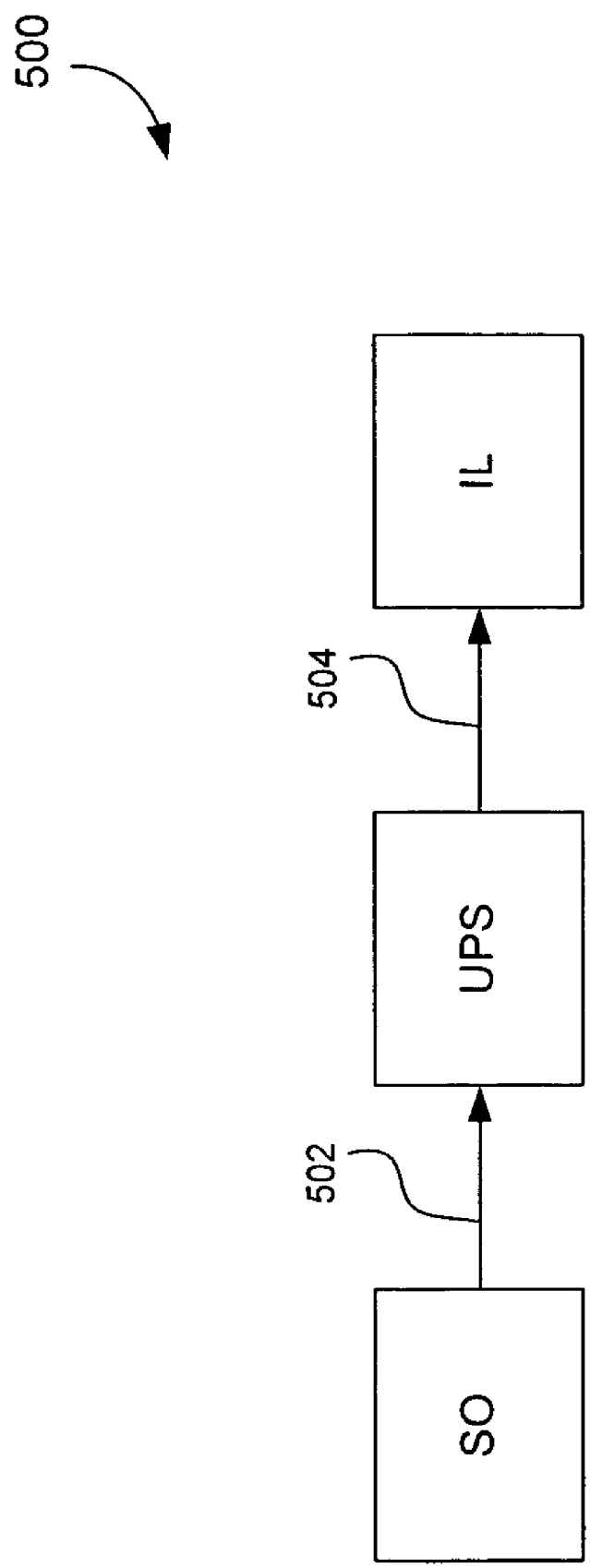
Figure 6:
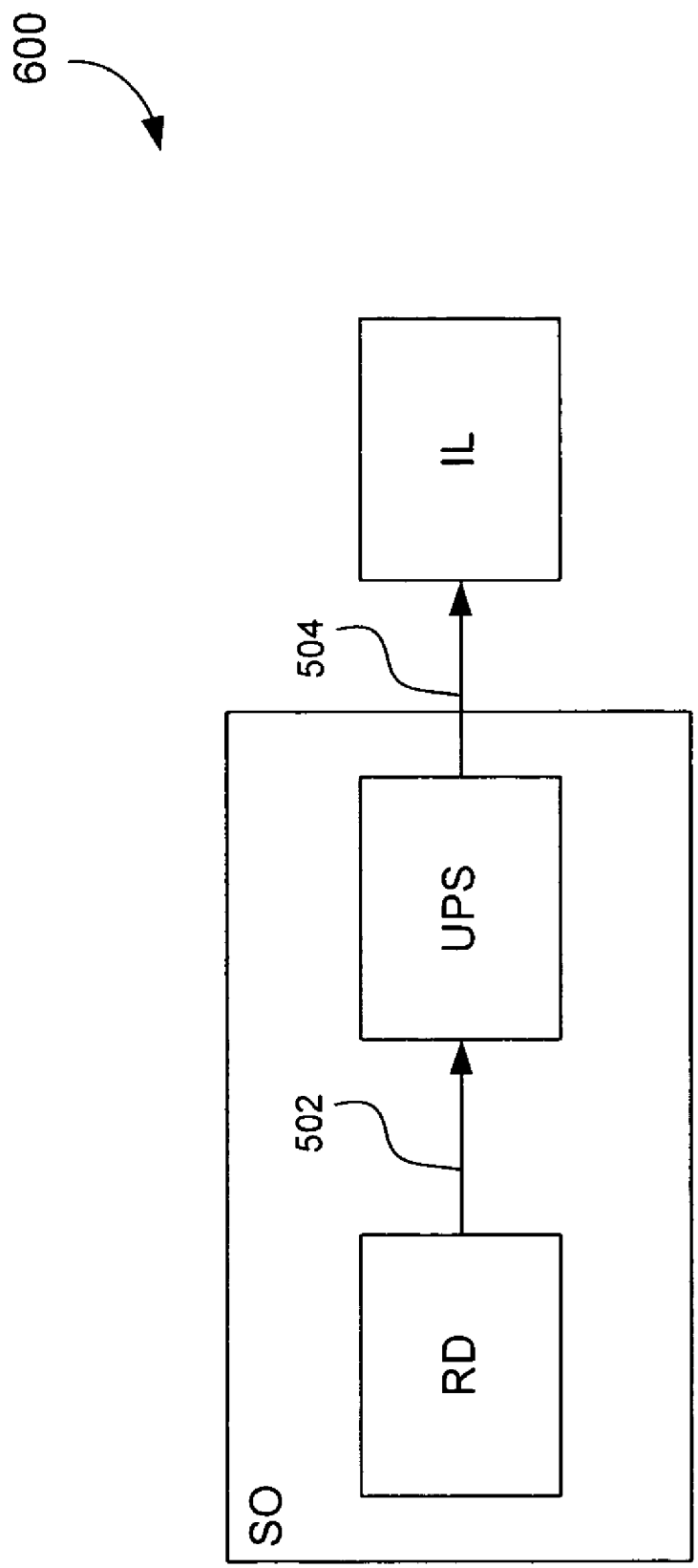
Figure 7:
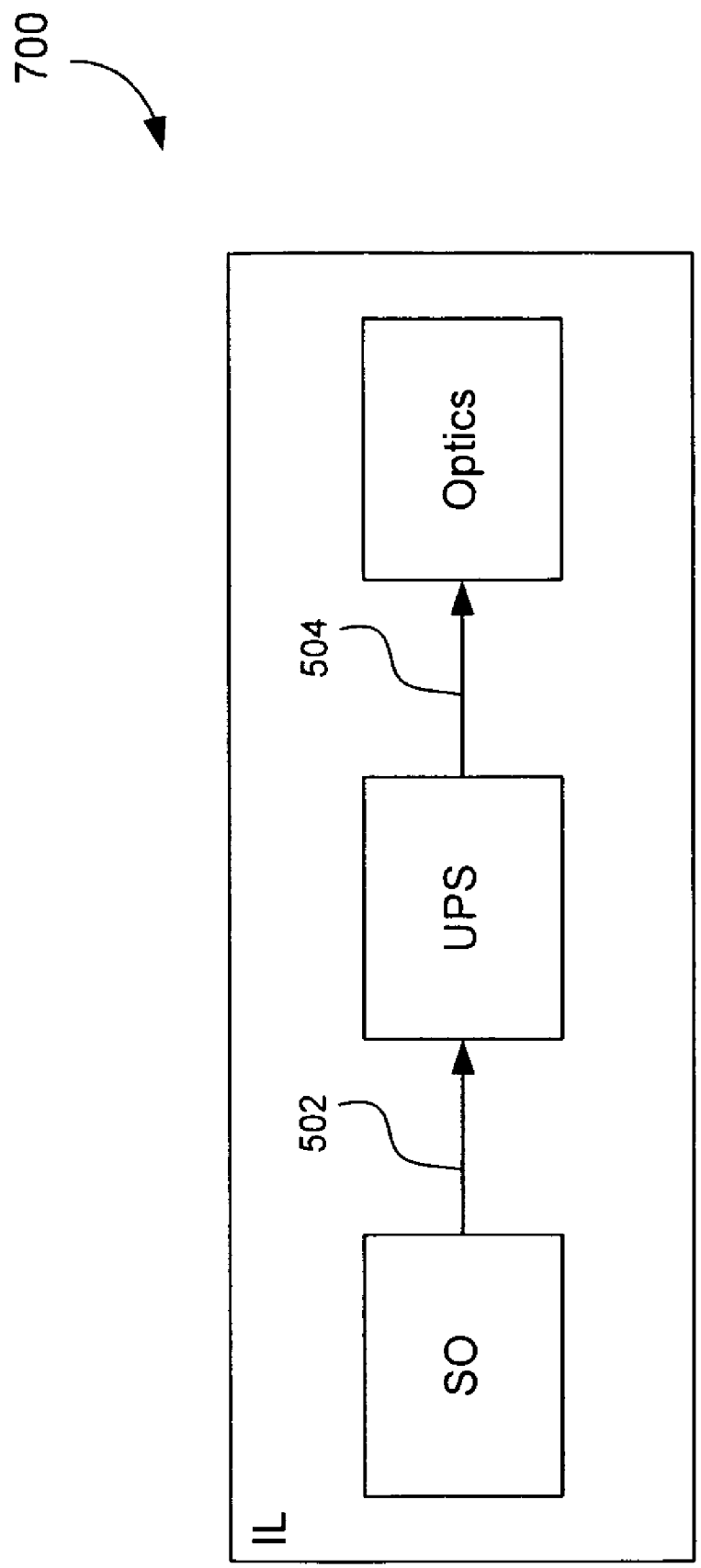

FIGS. 5, 6, and 7 show various radiation producing arrangements including an unpolarizing system, according to various embodiments of the present invention.

Figure 8:
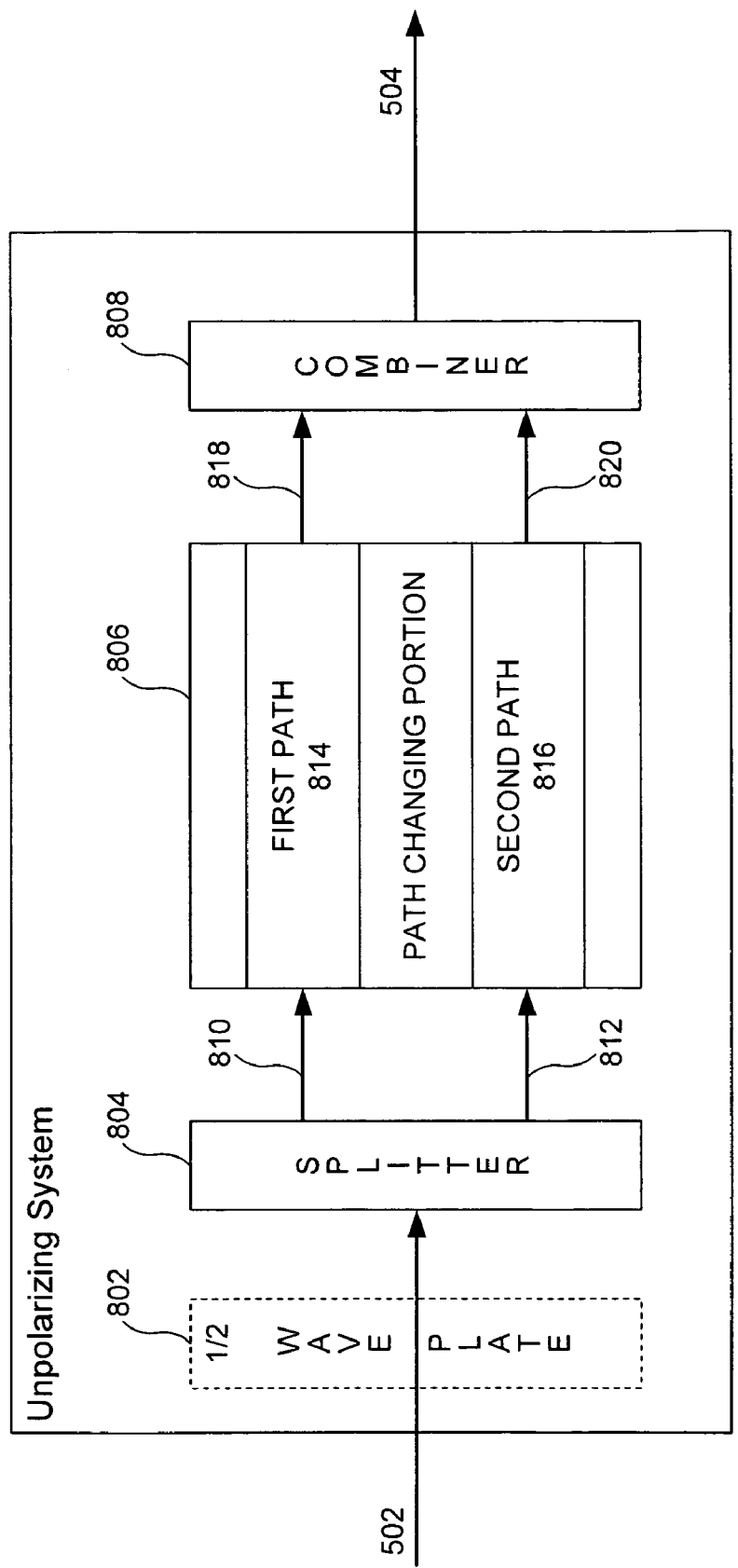

FIG. 8 shows a unpolarizing system, according to one embodiment of the present invention.

Figure 9:
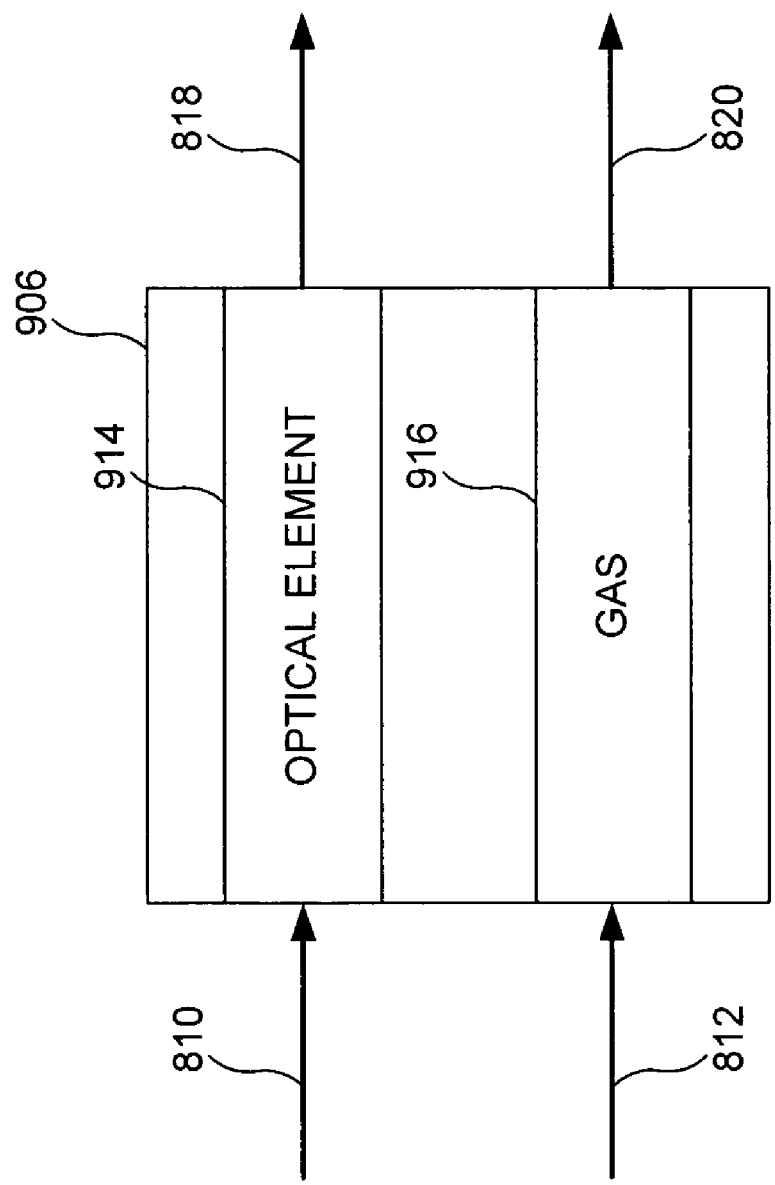
Figure 10:
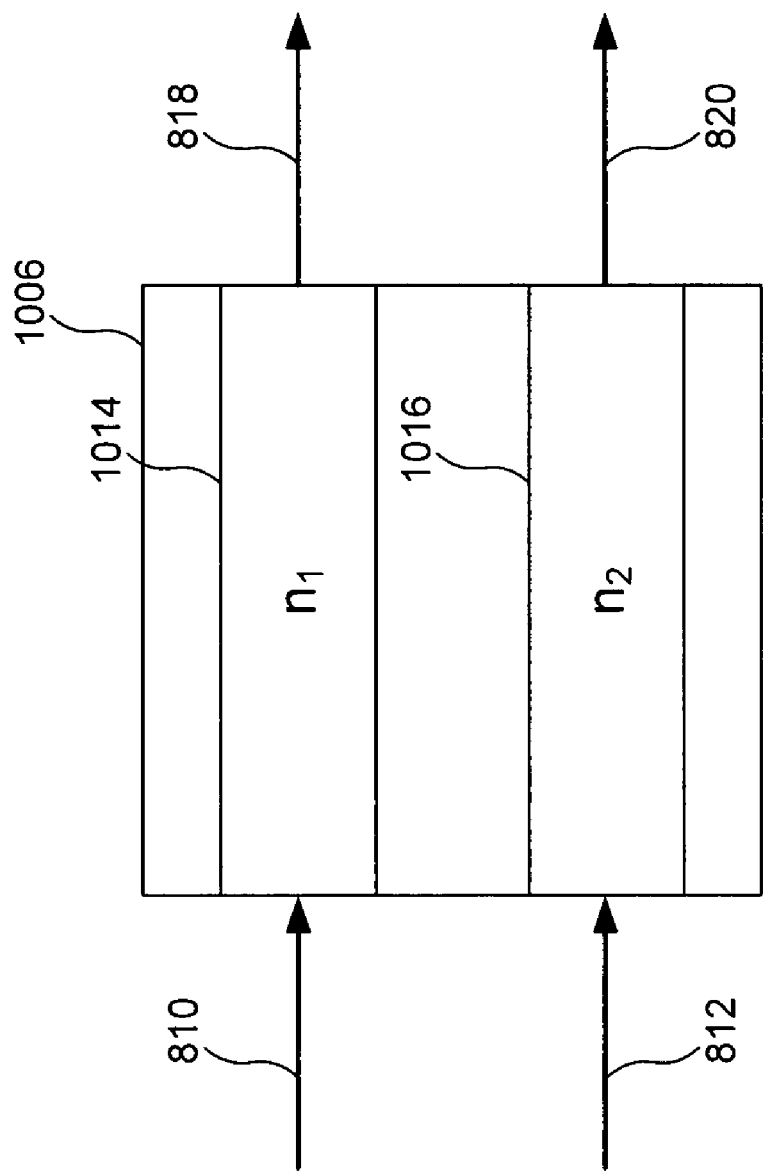

FIGS. 9 and 10 show various path changing portions of an unpolarizing system, according to various embodiments of the present invention.

Figure 11:
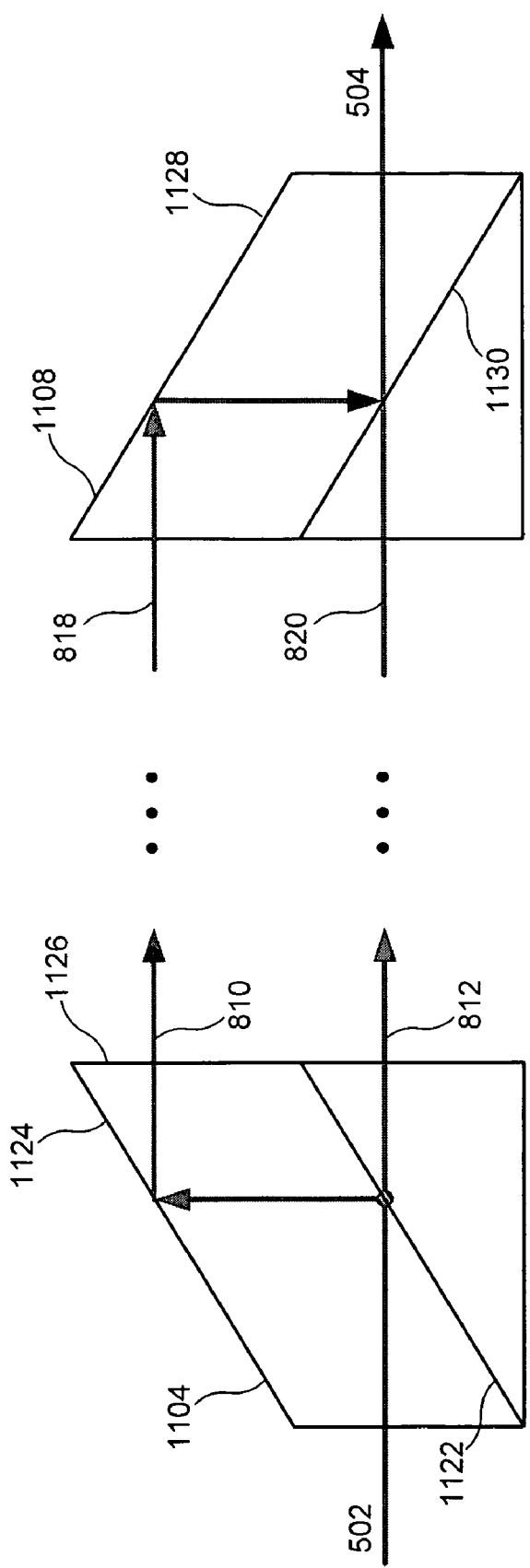
Figure 12:
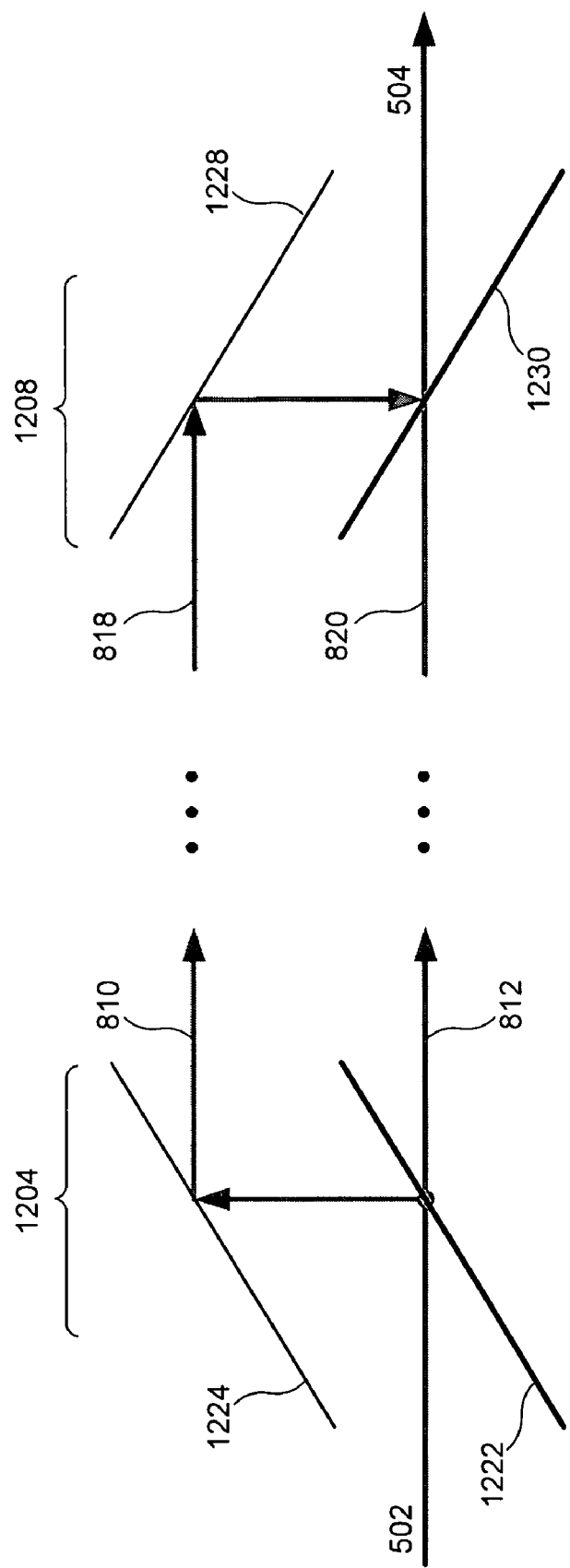

FIGS. 11 and 12 show various splitter and combiner configurations of an unpolarized system, according to various embodiments of the present invention.

Figure 13:
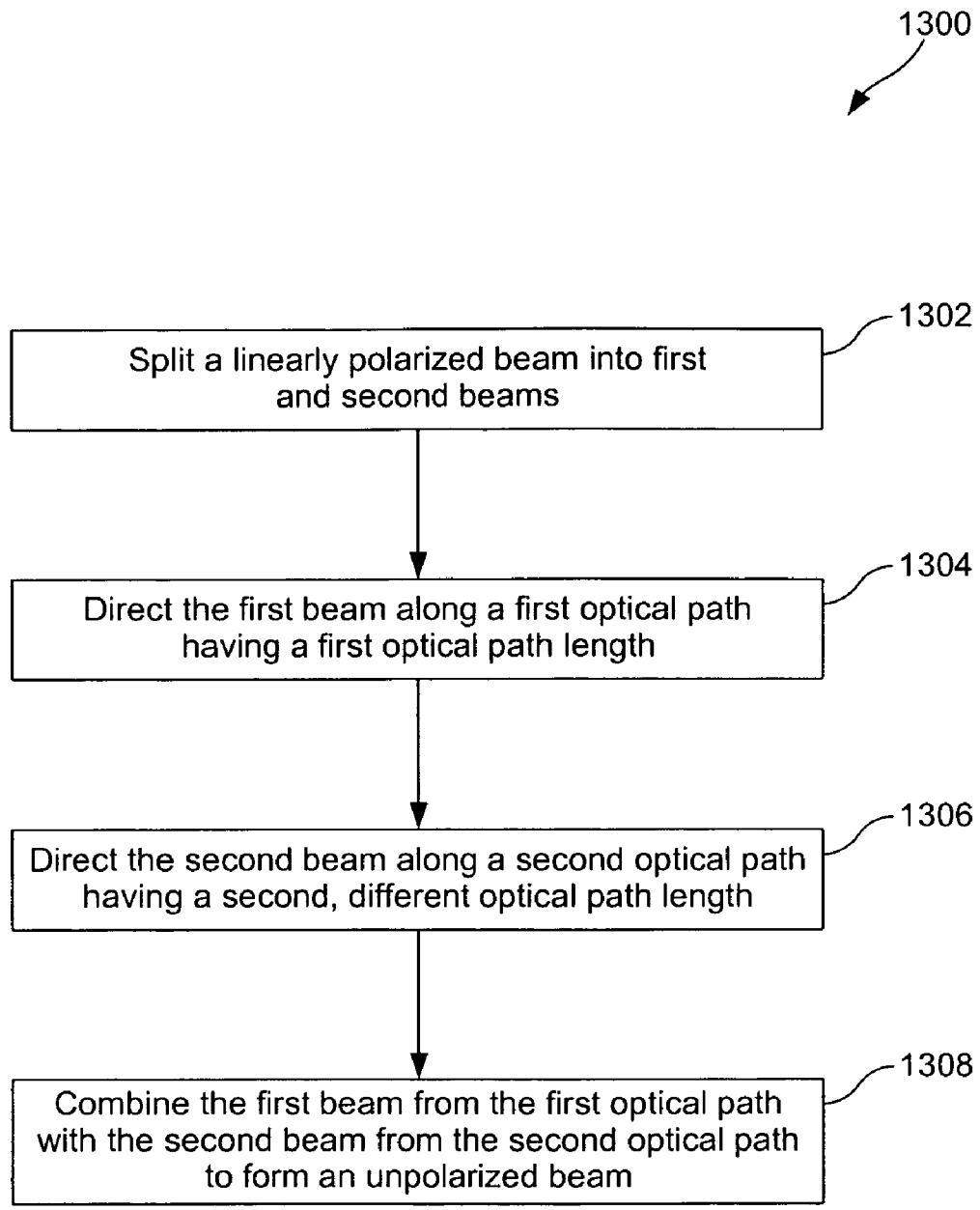

FIG. 13 is a flowchart depicting a method, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
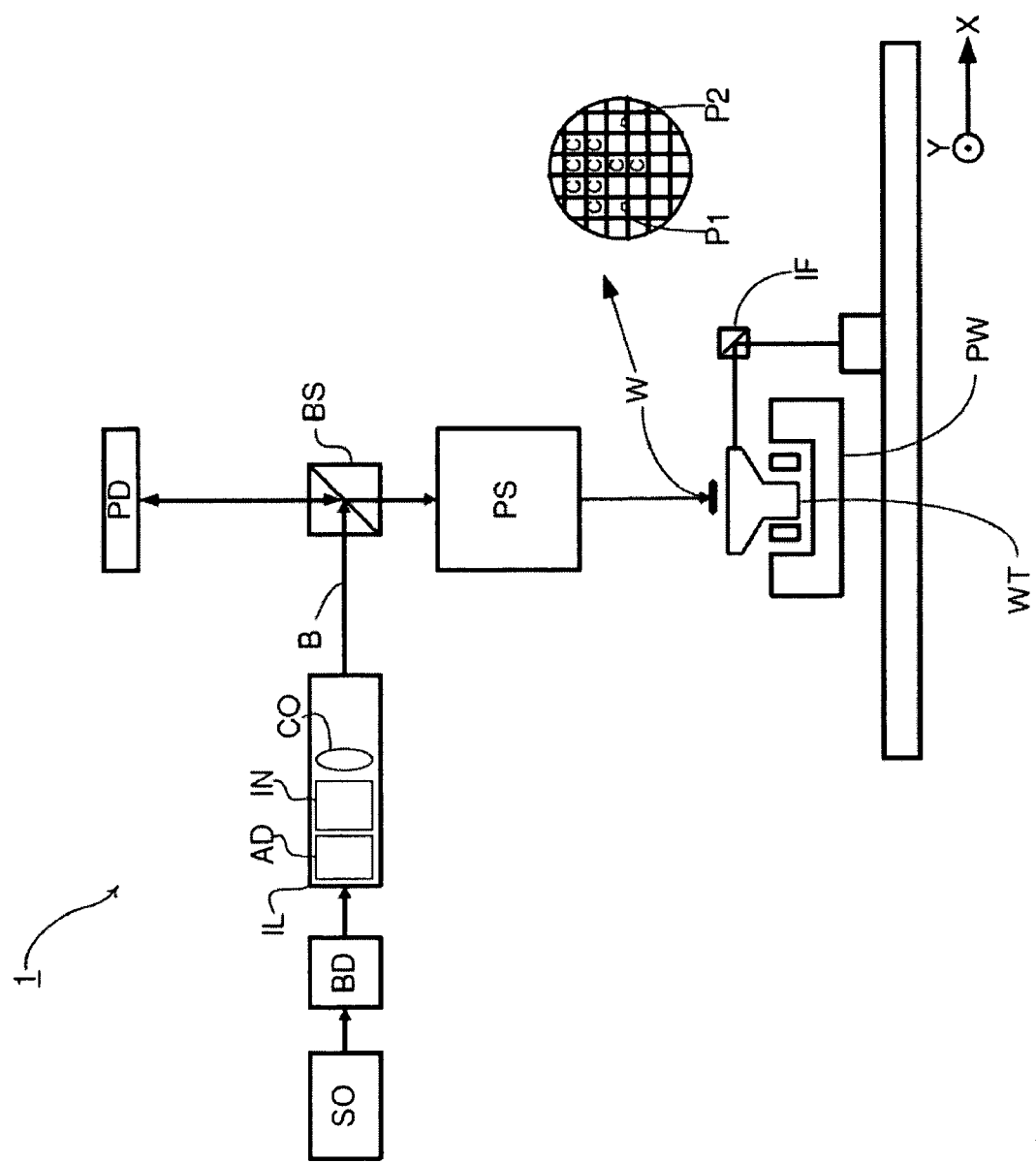
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In various examples, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In one example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
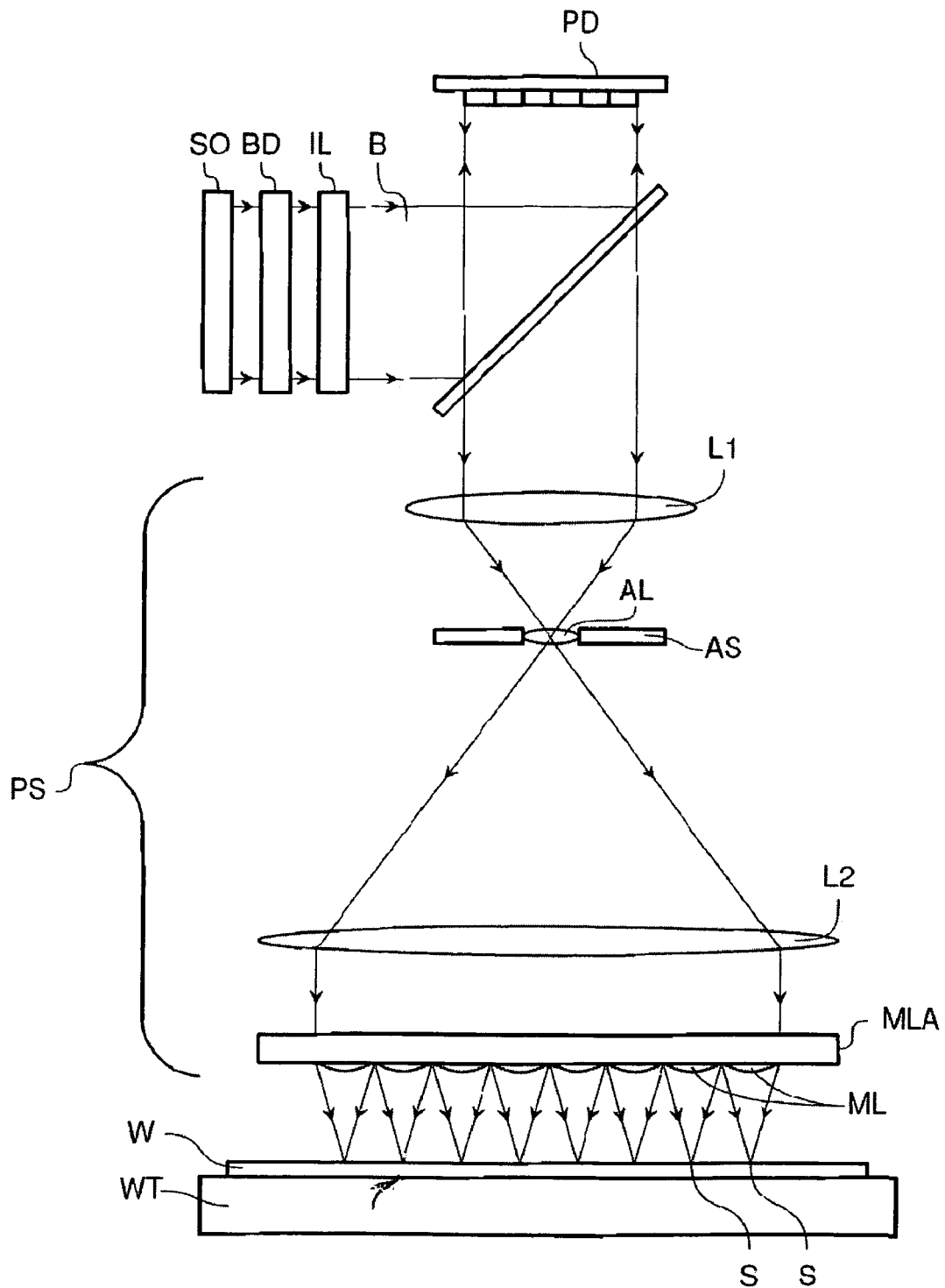

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
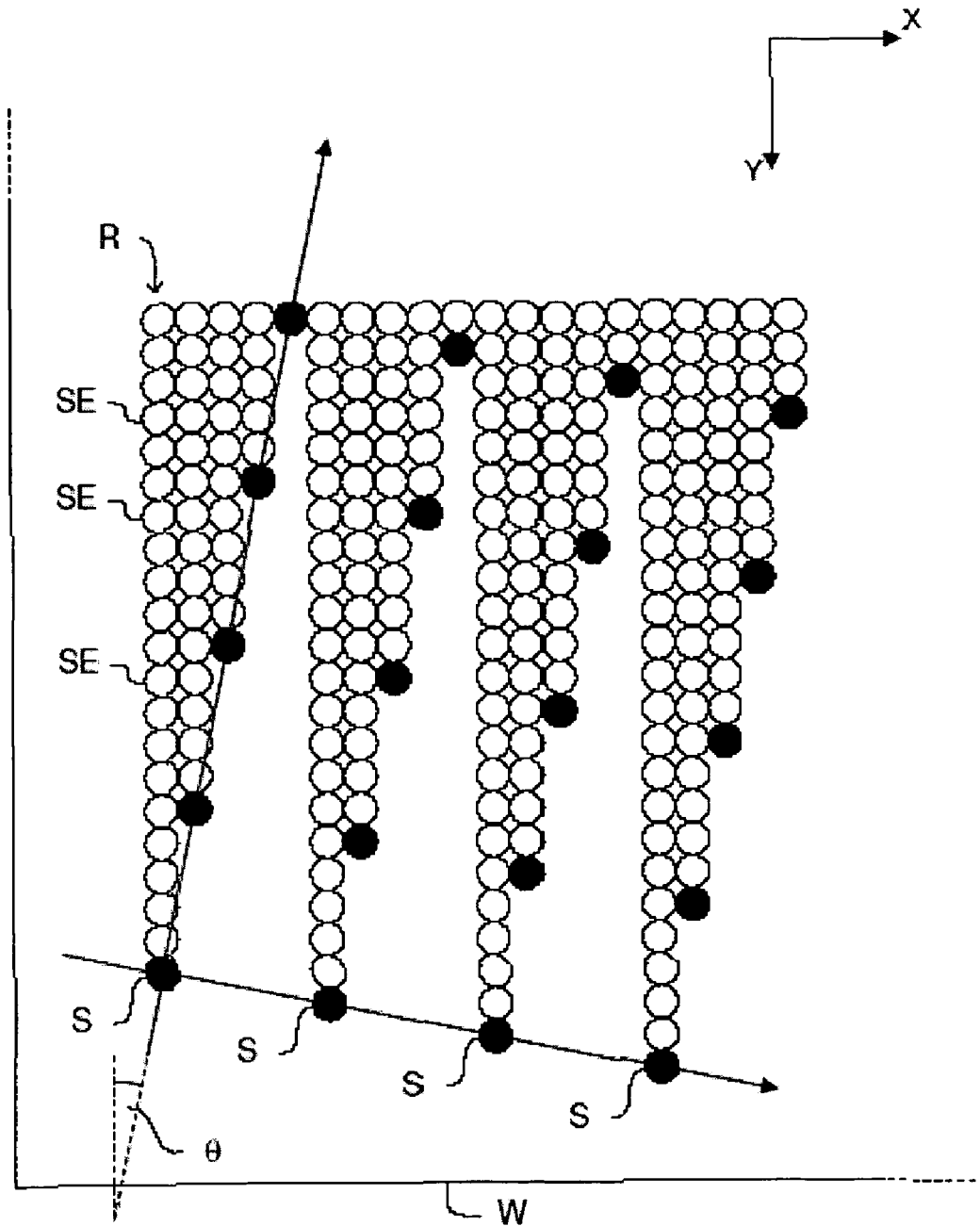
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
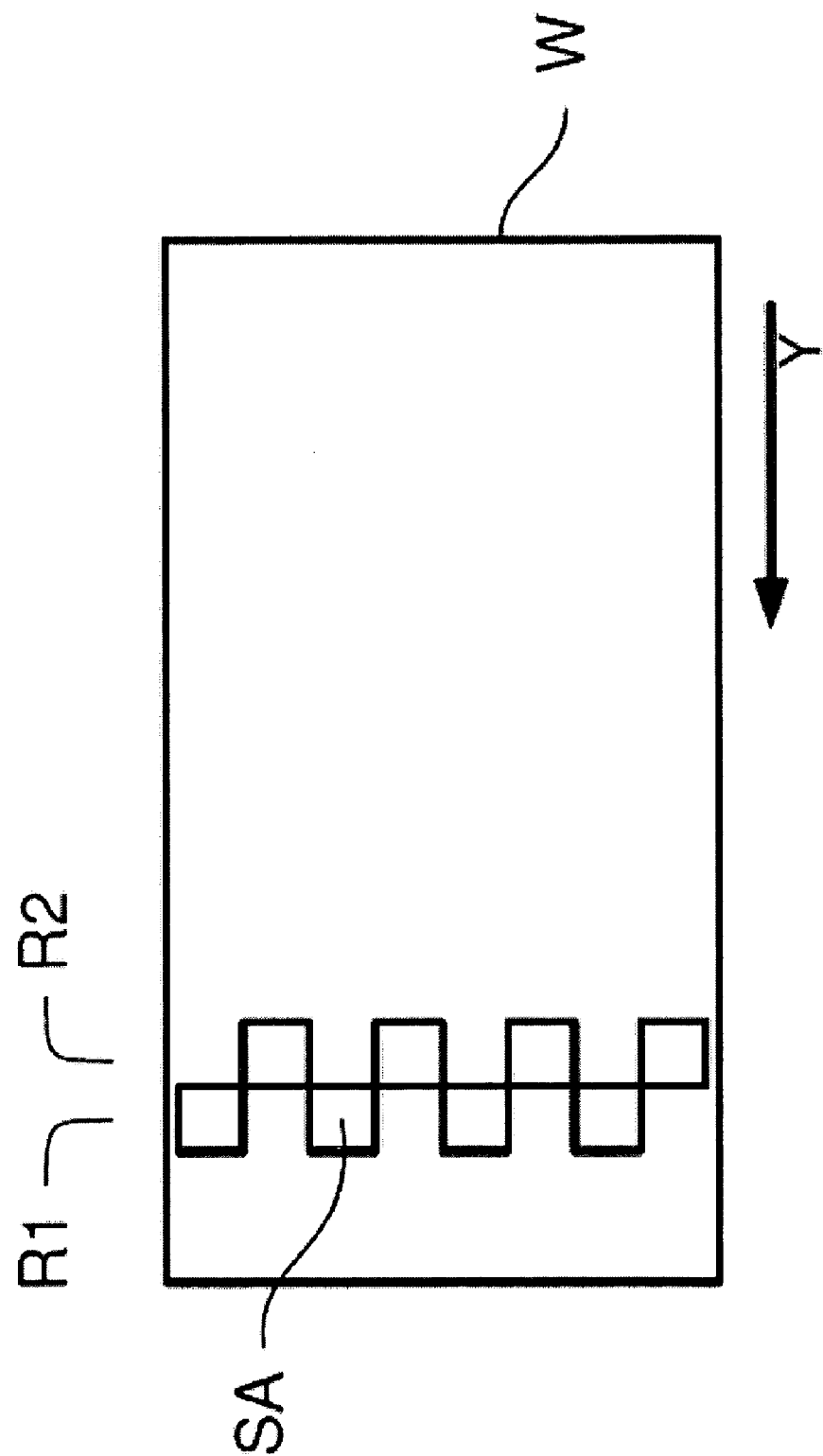
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Radiation Producing Arrangements

FIGS. 5, 6, and 7 show various radiation producing systems 500, 600, and 700, respectively, including an unpolarizing system UPS.

FIG. 5 shows a radiation system 500, according to one embodiment of the present invention. Radiation system 500 includes a radiation source SO, an unpolarizing system UPS, and an illuminator IL. Source SO and unpolarizing system UPS are located separately from illuminator IL. For example, unpolarizing system UPS can be used in place of, or included in, beam delivery system BD in FIGS. 1 and 2.

Radiation source SO produces a linearly polarized radiation beam 502, which is formed into unpolarized beam 504 using unpolarizing system UPS. As discussed in more detail below with respect to FIGS. 8-12, unpolarizing system UPS allows for splitting of linearly polarized light into first and second beams of light, in one example having opposite polarization directions. The first and second beams of light travel through respective first and second unequal optical path lengths before being combined, such that unpolarized beam 504 is produced.

FIG. 6 shows a radiation system 600, according to another embodiment of the present invention. Radiation system 600 includes a radiation SO, which comprises a radiation device RD and an unpolarizing system UPS, and an illuminator IL. Additionally, or alternatively, a beam delivery system BD (not shown, but see FIGS. 1 and 2) may also be included in radiation system 600 between radiation source SO and illuminator IL. Radiation system 600 functions similarly to radiation system 500, discussed above. One exception is that radiation source SO produces unpolarized radiation 504 using unpolarizing system UPS. Additionally, or alternatively, some source SO functions occur in front and some occur behind unpolarizing system UPS.

FIG. 7 shows a radiation system 700, according to a further embodiment of the present invention. Radiation system 700 has an illuminator IL comprising a radiation source SO and an unpolarizing system UPS. Additionally, or alternatively, light exiting unpolarizing system UPS may be directed onto optics or onto a patterning device (not shown, but see FIGS. 1 and 2). Radiation system 700 functions similarly to radiation system 500, discussed above. Additionally, or alternatively, some illuminator IL functions occur in front and some occur behind unpolarizing system UPS.

Alternatively, or additionally, radiation systems 500, 600, and 700 can be used for other illumination systems of a lithography apparatus, i.e., other than an exposure illumination system, such as an alignment illumination system or detection system, without departing from the scope of the present invention.

Additionally, or alternatively, radiation systems 500, 600, and 700 can be used in place of any illumination system that requires forming of an unpolarized light beam and/or more uniform light.

Exemplary Unpolarizing System Configurations

FIG. 8 shows a unpolarizing system UPS, according to one embodiment of the present invention. Unpolarizing system UPS includes an optional half wave plate 802, a beam splitter 804, a pattern changing portion 806, and a combiner 808.

Linear polarized beam 502 enters unpolarizing system UPS either at half wave plate 802 or at splitter 804. When entering at splitter 804, beam 502 is split into first and second beams 810 and 812, respectively. For example, first beam 810 can correspond to a first polarization direction, e.g., horizontal polarization, while second beam 812 can correspond to a second polarization direction, e.g., vertical polarization, or vice versa. In this example, splitter 804 can be a polarizing splitter, as described below with respect to FIGS. 11 and 12.

First beam 810 travels along first optical light path 814, while second beam 812 travels along second optical light path 816. First and second optical light paths 814 and 816 have different optical path lengths. As described below with respect to FIGS. 9 and 10, the different optical path lengths can result from using materials or components to form first and second optical paths 814 and 816 that have different indices of refraction. First and second output beams 818 and 820 are output from corresponding first and second optical paths 814 and 816 and are combined using combiner 808 to form unpolarized beam 504.

Additionally, or alternatively, at least one of the first and second path lengths is more than a temporal coherence length of beam 502.

Additionally, or alternatively, using half wave plate 802 in combination with beam splitter 804 allows for tuning of intensities of first and second output beams 818 and 820 based on their respective polarization directions. This tuning can allow for first and second output beams 818 and 820 to have uniform intensity, such that unpolarized beam 504 has uniform intensity. Additionally, or alternatively, the tuning can be enhanced through rotating of half wave plate 802.

FIGS. 9 and 10 show various path changing portions 906 and 1006 of an unpolarizing system UPS, according to various embodiments of the present invention.

FIG. 9 shows a path changing portion 906, according to one embodiment of the present invention. Path changing portion 906 includes an optical element 914 (e.g., an optical delay device) that forms the first path and a gas (or similar material) 916 that forms the second path. Optical element 914 and gas 916 have different indices of refraction, such that different apparent or effective optical path lengths are formed for light traveling through the first and second optical paths. In optics, an optical path length (e.g., effective or apparent optical path length) is a product of a geometric length of a path light follows through a system and an index of refraction of a medium through which the light propagates. A difference in optical path length between two paths is often called an optical path difference. Optical path length is important because it determines a phase of the light and governs interference and diffraction of the light as it propagates.

Alternatively, or additionally, first and second beams 810 and 812 travel through optical element 914 and gas 916 to form first and second output beams 818 and 820 that are incoherent with respect to each other. For example, as discussed above, the incoherence between first and second output beams 818 and 820 can be because one of the first and second optical path lengths is longer by more than the temporal coherence length of beam 502 than the other one of the first and second optical path lengths.

FIG. 10 shows a path changing portion 1006, according to a further embodiment of the present invention. Path changing portion 1006 includes a first optical element or material 1014 that has a first index of refraction ni and that forms the first optical path, and a second optical element or material 1016 that has a second index of refraction $n_2$ and that forms the second optical path. First index of refraction $n_1$ is different than second index of refraction $n_2$, such that different (apparent or effective) optical path lengths are formed for light traveling through the first and second optical paths.

Additionally, or alternatively, first and second beams 810 and 812 travel through first and second optical elements or materials 1014 and 1016 to form first and second output beams 818 and 820 that are incoherent with respect to each other based on traveling through the different optical path lengths. For example, as discussed above, the incoherence between the first and second output beams 818 and 820 can be because one of the first and second optical path lengths is longer by more than the temporal coherence length of beam 502 than the other one of the first and second optical path lengths.

FIGS. 11 and 12 show various exemplary beam splitter 1104/1204 and combiner 1108/1208 configurations, according to various embodiments of the present invention. Other splitting and combining systems could also be used, as would be apparent to a skilled artisan upon reading and understanding this description.

FIG. 11 shows a beam splitting cube 1104 and beam combining cube 1108, according to one embodiment of the present invention. Beam 502 entering beam splitting cube 1104 splits at splitting surface 1122. Splitting surface 1122 reflects part of beam 502, e.g., first beam 810, towards surface 1124, which reflects first beam 810 through surface 1126 and along the first optical path (not shown). Also, splitting surface 1122 transmits part of beam 502, e.g., second beam 812, along the second optical path (not shown). On the other end of a path changing portion (not shown) first and second output beams 818 and 820 enter beam combining cube 1108. First output beam 818 is reflected from surface 1128 and surface 1130 of cube 1108 before exiting cube 1108, while second output beam 820 transmits through surface 1130 of cube 1108 before exiting cube 1108. Thus, surface 1130 combines first and second output beams 818 and 820 to form unpolarized beam 504.

Additionally, or alternatively, splitting and combining cubes 1104 and 1108 can be polarizing. Thus, splitting cube 1104 transmits and reflects beam 502 based on polarization directions of respective portions of beam 502 and combining cube 1108 transmits and reflects respective first and second output beams 818 and 820 based on their respective polarization direction.

Alternatively, or additionally, surfaces 1122 and 1130 can include a coating that allows for the splitting and combining functionality.

FIG. 12 shows a beam splitting system 1204 and beam combining system 1208, according to another embodiment of the present invention. Beam splitting system 1204 includes a beam splitting device 1222 and a reflecting device 1224, while beam combining system 1208 includes a reflecting device 1228 and a combining device 1230. Beam 502 entering beam splitting system 1204 splits at splitting device 1222. Splitting device 1222 reflects part of beam 502, e.g., first beam 810, towards reflector 1224, from which first beam 810 reflects before entering a first optical path (not shown). Also, splitting device 1222 transmits part of beam 502, e.g., second beam 812, along a second path (not shown). On the other end of a path changing portion (not shown) first and second output beams 818 and 820 enter beam combining system 1208. First output beam 818 is reflected from reflecting device 1228 and from combining device 1230 before exiting combining system 1208, while second output beam 820 transmits through combining device 1230 before exiting combining system 1208. Thus, combining device 1230 combines first and second output beams 818 and 820 to form unpolarized beam 504.

Additionally, or alternatively, splitting and combining systems 1204 and 1208 can be polarizing. Thus, splitting and combining systems 1204 and 1208 transmit and reflect beams 502, 818, and 820 based on polarization directions of respective portions of beam 502 and respective polarization directions of first and second output beams 818 and 820.

Alternatively, or additionally, surfaces of splitting device 1222 and combining device 1230 can include a coating that allows for the splitting and combining functionality.

Exemplary Operation

FIG. 13 is a flowchart depicting a method 1300 for generating unpolarized light, according to one embodiment of the present invention. Method 1300 can be performed using any one of the systems described above that form unpolarized light 504.

In step 1302, a linearly polarized beam is split into first and second beams. In step 1304, the first beam is directed along a first optical path having a first optical path length. In step 1306, the second beam is directed along a second optical path having a second, different optical path length. In step 1308, the first beam from the first optical path is combined with the second beam from the second optical path to form an unpolarized beam.

Additionally, or alternatively, the unpolarized beam can be an illumination beam. Additionally, or alternatively, the illumination beam can be patterned and the patterned beam can projected onto a target portion of a substrate.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system, comprising:
   a source of radiation that produces a linearly polarized beam; and
   an unpolarizing system comprising,
      a splitter configured to split the linearly polarized beam into first and second portions,
      first and second optical paths, the first portion of the split beam travels along the first optical path that has a first path length and the second portion of the split beam travels along the second optical path that has a second path length, the second path length being different than the first path length,
      a combiner configured to combine the first and second portions to form an unpolarized beam, and
      a rotatable half wave plate located before the splitter configured to tune an intensity of at least one of the first or second portions of the split beam,
      wherein the tuning produces a uniform intensity of the first and second portions.

2. The system of claim 1, wherein:
   the splitter is a polarizing beam splitting system that is configured to perform the splitting of the linearly polarized beam based on respective polarization directions within the linearly polarized beam; and
   the combiner is a polarizing beam combining system that is configured to perform the combining of the first and second portions of the split beam based on their respective polarization directions.

3. The system of claim 2, wherein:
   the polarizing beam splitting system is a beam splitting cube; and
   the polarizing beam combining system is a beam combining cube.

4. The system of claim 2, wherein:
   the polarizing beam splitting system comprises a beam splitter and a reflecting device; and
   the polarizing beam combining system comprises a beam combiner and a reflecting device.

5. The system of claim 1, wherein the unpolarizing system further comprises:
   an optical element configured to form the first optical path; and
   a gaseous area configured to form the second optical path.

6. The system of claim 5, wherein the gaseous area comprises vacuum or air.

7. The system of claim 1, wherein a length of at least one of the first and second optical paths is longer than a temporal coherence length of the linearly polarized beam.

8. The system of claim 1, wherein the first and second optical paths include portions having different indices of refraction, which results in the difference between the first and second optical path lengths.

9. The system of claim 1, further comprising:
   a patterning device that patterns the unpolarized beam; and
   a projection system that projects the patterned beam onto a target portion of a substrate.

10. The system of claim 9, further comprising:
    an illumination system that processes the unpolarized beam and directs the unpolarized beam onto the patterning device.

11. The system of claim 10, wherein the illumination system comprises the radiation source and the unpolarizing system.

12. A lithography system, comprising:
    an illumination system that generates an illumination beam of radiation, comprising,
       a source of radiation, and
       an unpolarizing system comprising,
          a splitter,
          first and second optical paths,
          a combiner, and a rotatable half wave plate located before the splitter configured to tune a uniform intensity of the illumination beam;

a patterning device that patterns the illumination beam of radiation; and a projection system that projects the patterned beam onto a target portion of a substrate.

13. The lithography system of claim 12, wherein:

the splitter is a polarizing beam splitting system that is configured to perform splitting of a linearly polarized beam produced by the source of radiation into first and second portions based on respective polarization directions within the linearly polarized beam; and the combiner is a polarizing beam combining system that is configured to perform combining of the first and second portions of the split beam based on their respective polarization directions.

14. The lithography system of claim 12, wherein the unpolarizing system further comprises:

an optical element configured to form the first optical path; and a gaseous area configured to form the second optical path.

15. The lithography system of claim 12, wherein a path length of at least one of the first and second optical paths is longer than a temporal coherence length of the linearly polarized beam.

16. The lithography system of claim 12, wherein the first and second optical paths include portions having different indices of refraction, which results in the difference between the first and second optical path lengths.

17. A method, comprising:

(a) splitting a linearly polarized beam into first and second beams;

(b) directing the first beam along a first optical path having a first optical path length;

(c) directing the second beam along a second optical path having a second optical path length, the second path length being different than the first path length;

(d) combining the first beam from the first optical path with the second beam from the second optical path to form an unpolarized beam, and (e) tuning of an intensity of at least one of the first beam or the second beam based on respective polarization directions of the first beam and the second beam, wherein the tuning produces a uniform intensity of the first and second beams.

18. The method of claim 17, further comprising:

basing step (b) on polarizations directions of light within the linearly polarized beam; and basing step (d) on respective polarization directions of the first and second beams.

19. The method of claim 17, wherein a path length of at least one of the first and second optical paths is longer than a temporal coherence length of the linearly polarized beam.

20. The method of claim 17, wherein the first and second optical paths include portions having different indices of refraction, which results in the difference between the first and second optical path lengths.

21. The method of claim 17, further comprising:

patterning the unpolarized beam; and projecting the patterned beam on a target portion of a substrate.

22. Forming an integrated circuit on a wafer using the method of claim 21.

23. Forming a flat panel device on a flat panel glass substrate using the method of claim 21.

24. A laser that outputs an unpolarized beam, comprising:

a source of radiation that produces a linearly polarized beam; and an unpolarizing system comprising, a splitter configured to split the linearly polarized beam into first and second portions, first and second optical paths, the first portion of the split beam travels along the first optical path that has a first path length and the second portion of the split beam travels along the second optical path that has a second path length, the second path length being different than the first path length, a combiner configured to combine the first and second portions to form an unpolarized beam, and a rotatable half wave plate located before the splitter configured to tune an intensity of at least one of the first or second portions of the split beam, wherein the tuning produces a uniform intensity of the first and second portions.

25. The laser of claim 24, wherein:

the splitter is a polarizing beam splitting system that is configured to perform the splitting of the linearly polarized beam based on respective polarization directions within the linearly polarized beam; and the combiner is a polarizing beam combining system that is configured to perform the combining of the first and second portions of the split beam based on their respective polarization directions.

26. The laser of claim 24, wherein the unpolarizing system further comprises:

an optical element configured to form the first optical path; and a gaseous area configured to form the second optical path.

27. The laser of claim 24, wherein a path length of at least one of the first and second optical paths is longer than a temporal coherence length of the linearly polarized beam.

28. The laser of claim 24, wherein the first and second optical paths include portions having different indices of refraction, which results in the difference between the first and second optical path lengths.

29. An illuminator that outputs an unpolarized beam, comprising:

a source of radiation that produces a linearly polarized beam; and an unpolarizing system comprising, a splitter configured to split the linearly polarized beam into first and second portions, first and second optical paths, the first portion of the split beam travels along the first optical path that has a first path length and the second portion of the split beam travels along the second optical path that has a second path length, the second path length being different than the first path length, a combiner configured to combine the first and second portions to form an unpolarized beam, and a rotatable half wave plate located before the splitter configured to tune an intensity of at least one of the first or second portions of the split beam, wherein the tuning produces a uniform intensity of the first and second portions.

30. The illuminator of claim 29, wherein:

the splitter is a polarizing beam splitting system that is configured to perform the splitting of the linearly polarized beam based on respective polarization directions within the linearly polarized beam; and the combiner is a polarizing beam combining system that is configured to perform the combining of the first and second portions of the split beam based on their respective polarization directions.

31. The illuminator of claim 29, wherein the unpolarizing system further comprises:

an optical element configured to form the first optical path; and a gaseous area configured to form the second optical path.

32. The illuminator of claim 29, wherein a path length of at least one of the first and second optical paths is longer than a temporal coherence length of the linearly polarized beam.

33. The illuminator of claim 29, wherein the first and second optical paths include portions having different indices of refraction, which results in the difference between the first and second optical path lengths.

* * * * *